(12) United States Patent
Basceri et al.

(10) Patent No.: US 7,056,806 B2
(45) Date of Patent: Jun. 6, 2006

(54) MICROFEATURE WORKPIECE PROCESSING APPARATUS AND METHODS FOR CONTROLLING DEPOSITION OF MATERIALS ON MICROFEATURE WORKPIECES

(75) Inventors: Cem Basceri, Boise, ID (US); Trung T. Doan, Pflugerville, TX (US); Ronald A. Weimer, Boise, ID (US); Kevin L. Beaman, Boise, ID (US); Lyle D. Breiner, Meridian, ID (US); Lingyi A. Zheng, Boise, ID (US); Er-Xuan Ping, Meridian, ID (US); Demetrius Sarigiannis, Boise, ID (US); David J. Kubista, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 142 days.

(21) Appl. No.: 10/665,099

(22) Filed: Sep. 17, 2003

(65) Prior Publication Data

US 2005/0059261 A1    Mar. 17, 2005

(51) Int. Cl.
H01L 21/76 (2006.01)
H01L 21/20 (2006.01)
H01L 21/36 (2006.01)
H01L 21/04 (2006.01)
H01L 21/261 (2006.01)

(52) U.S. Cl. ............... 438/448; 438/485; 438/487; 438/689; 438/778; 438/788; 438/789

(58) Field of Classification Search ............ 438/448, 438/485, 487, 689, 778, 788, 789
See application file for complete search history.

(56) References Cited

U.S. PATENT DOCUMENTS 579,269 A    3/1897 Hent ..................... 427/62
3,618,919 A    11/1971 Beck .................... 432/237

(Continued)

FOREIGN PATENT DOCUMENTS

DE    198 51 824 A1    5/2000

(Continued)

OTHER PUBLICATIONS

Takahashi, K. et al., "Process Integration of 3D Chip Stack with Vertical Interconnection," pp. 601-609, 2004 Electronic Components and Technology Conference, IEEE, Jun. 2004.

(Continued)

*Primary Examiner*—William M. Brewster
(74) *Attorney, Agent, or Firm*—Perkins Coie LLP

(57) ABSTRACT

The present disclosure provides methods and apparatus useful in depositing materials on batches of microfeature workpieces. One implementation provides a method in which a quantity of a first precursor gas is introduced to an enclosure at a first enclosure pressure. The pressure within the enclosure is reduced to a second enclosure pressure while introducing a purge gas at a first flow rate. The second enclosure pressure may approach or be equal to a steady-state base pressure of the processing system at the first flow rate. After reducing the pressure, the purge gas flow may be increased to a second flow rate and the enclosure pressure may be increased to a third enclosure pressure. Thereafter, a flow of a second precursor gas may be introduced with a pressure within the enclosure at a fourth enclosure pressure; the third enclosure pressure is desirably within about 10 percent of the fourth enclosure pressure.

31 Claims, 5 Drawing Sheets

U.S. PATENT DOCUMENTS

| | | | |
|---|---|---|---|
| 3,620,934 A | 11/1971 | Endle | 205/87 |
| 3,630,769 A | 12/1971 | Hart et al. | 384/555 |
| 3,630,881 A | 12/1971 | Lester et al. | 427/62 |
| 3,634,212 A | 1/1972 | Valayll et al. | 205/104 |
| 4,018,949 A | 4/1977 | Donakowski et al. | 427/327 |
| 4,242,182 A | 12/1980 | Popescu | 205/303 |
| 4,269,625 A | 5/1981 | Molenaar | 106/1.22 |
| 4,289,061 A | 9/1981 | Emmett | 411/38 |
| 4,397,753 A | 8/1983 | Czaja | 252/79.3 |
| 4,438,724 A | 3/1984 | Doehler et al. | 118/719 |
| 4,469,801 A | 9/1984 | Hirai et al. | 501/96.1 |
| 4,545,136 A | 10/1985 | Izu et al. | 34/636 |
| 4,590,042 A | 5/1986 | Drage | 422/186.06 |
| 4,681,777 A | 7/1987 | Engelken et al. | 438/572 |
| 4,826,579 A | 5/1989 | Westfall | 205/560 |
| 4,948,979 A | 8/1990 | Munakata et al. | 250/492.2 |
| 4,949,669 A | 8/1990 | Ishii et al. | 118/719 |
| 4,966,646 A | 10/1990 | Zdeblick | 216/2 |
| 4,977,106 A | 12/1990 | Smith | 438/680 |
| 5,076,205 A | 12/1991 | Vowles et al. | 118/719 |
| 5,091,207 A | 2/1992 | Tanaka | 427/8 |
| 5,131,752 A | 7/1992 | Yu et al. | 356/369 |
| 5,136,975 A | 8/1992 | Bartholomew et al. | 118/715 |
| 5,172,849 A | 12/1992 | Barten et al. | 228/18 |
| 5,200,023 A | 4/1993 | Gifford et al. | 216/59 |
| 5,223,113 A | 6/1993 | Kaneko et al. | 204/298.33 |
| 5,232,749 A | 8/1993 | Gilton | 427/558 |
| 5,248,527 A | 9/1993 | Uchida et al. | 427/437 |
| 5,364,219 A | 11/1994 | Takahashi et al. | 414/217 |
| 5,377,429 A | 1/1995 | Sandhu et al. | 34/586 |
| 5,380,396 A | 1/1995 | Shikida et al. | 216/2 |
| 5,409,129 A | 4/1995 | Tsukada et al. | 220/62.22 |
| 5,418,180 A | 5/1995 | Brown | 438/398 |
| 5,427,666 A | 6/1995 | Mueller et al. | 204/192.17 |
| 5,433,835 A | 7/1995 | Demaray et al. | 204/298.09 |
| 5,445,491 A | 8/1995 | Nakagawa et al. | 417/850 |
| 5,480,818 A | 1/1996 | Matsumoto et al. | 438/150 |
| 5,498,292 A | 3/1996 | Ozaki | 118/72.1 |
| 5,500,256 A | 3/1996 | Watabe | 427/579 |
| 5,522,934 A | 6/1996 | Suzuki et al. | 118/723 AN |
| 5,536,317 A | 7/1996 | Crain et al. | 118/664 |
| 5,562,800 A | 10/1996 | Kawamura et al. | 414/806 |
| 5,589,002 A | 12/1996 | Su | 118/723 E |
| 5,592,581 A | 1/1997 | Okase | 392/418 |
| 5,595,606 A | 1/1997 | Fujikawa et al. | 118/725 |
| 5,599,513 A | 2/1997 | Masaki et al. | 422/311 |
| 5,624,498 A | 4/1997 | Lee et al. | 118/715 |
| 5,626,936 A | 5/1997 | Alderman | 428/68 |
| 5,640,751 A | 6/1997 | Faria | 29/525.02 |
| 5,643,394 A | 7/1997 | Maydan et al. | 156/345.33 |
| 5,654,589 A | 8/1997 | Huang et al. | 257/763 |
| 5,693,288 A | 12/1997 | Nakamura | 266/103 |
| 5,729,896 A | 3/1998 | Dalal et al. | 29/840 |
| 5,746,434 A | 5/1998 | Boyd et al. | 277/312 |
| 5,766,364 A | 6/1998 | Ishida et al. | 118/725 |
| 5,769,952 A | 6/1998 | Komino | 118/732 |
| 5,788,778 A | 8/1998 | Shang et al. | 134/1 |
| 5,792,269 A | 8/1998 | Deacon et al. | 118/715 |
| 5,792,700 A | 8/1998 | Turner et al. | 438/486 |
| 5,820,641 A | 10/1998 | Gu et al. | 55/434.4 |
| 5,827,370 A | 10/1998 | Gu | 118/715 |
| 5,833,888 A | 11/1998 | Arya et al. | 261/112.1 |
| 5,846,275 A | 12/1998 | Lane et al. | 55/431 |
| 5,846,330 A | 12/1998 | Quirk et al. | 118/723 DC |
| 5,851,849 A | 12/1998 | Comizzoli et al. | 438/38 |
| 5,865,417 A | 2/1999 | Harris et al. | 251/11 |
| 5,879,459 A | 3/1999 | Gadgil et al. | 118/715 |
| 5,895,530 A | 4/1999 | Shrotriya et al. | 118/715 |
| 5,908,947 A | 6/1999 | Vaartstra | 556/42 |
| 5,932,286 A | 8/1999 | Beinglass et al. | 427/255.18 |
| 5,953,634 A | 9/1999 | Kajita et al. | 438/687 |
| 5,956,613 A | 9/1999 | Zhao et al. | 438/648 |
| 5,968,587 A | 10/1999 | Frankel | 427/8 |
| 5,972,430 A | 10/1999 | DiMeo, Jr. et al. | 427/255.32 |
| 5,994,181 A | 11/1999 | Hsieh et al. | 438/239 |
| 5,997,588 A | 12/1999 | Goodwin et al. | 29/25.01 |
| 6,008,086 A | 12/1999 | Schuegraf et al. | 438/255 |
| 6,032,923 A | 3/2000 | Biegelsen et al. | 251/129.01 |
| 6,042,652 A | 3/2000 | Hyun et al. | 118/719 |
| 6,045,620 A | 4/2000 | Tepman et al. | 118/733 |
| 6,059,885 A | 5/2000 | Ohashi et al. | 118/730 |
| 6,062,256 A | 5/2000 | Miller et al. | 137/787.5 |
| 6,070,551 A | 6/2000 | Li et al. | 118/723 I |
| 6,079,426 A | 6/2000 | Subrahmanyam et al. | 139/1.1 |
| 6,080,446 A | 6/2000 | Tobe et al. | 427/255.394 |
| 6,086,677 A | 7/2000 | Umotoy et al. | 118/715 |
| 6,089,543 A | 7/2000 | Freerks | 251/357 |
| 6,109,206 A | 8/2000 | Maydan et al. | 118/723 IR |
| 6,123,107 A | 9/2000 | Selser et al. | 137/884 |
| 6,129,331 A | 10/2000 | Henning et al. | 251/11 |
| 6,139,700 A | 10/2000 | Kang et al. | 204/192.17 |
| 6,143,077 A | 11/2000 | Ikeda et al. | 118/715 |
| 6,143,078 A | 11/2000 | Ishikawa et al. | 118/715 |
| 6,143,659 A | 11/2000 | Leem | 438/688 |
| 6,144,060 A | 11/2000 | Park et al. | 257/310 |
| 6,149,123 A | 11/2000 | Harris et al. | 251/11 |
| 6,160,243 A | 12/2000 | Cozad | 219/439 |
| 6,161,500 A | 12/2000 | Kopacz et al. | 148/723 E |
| 6,173,673 B1 | 1/2001 | Golovato et al. | 118/723 E |
| 6,174,366 B1 | 1/2001 | Ihantola | 117/84 |
| 6,174,377 B1 | 1/2001 | Doering et al. | 118/729 |
| 6,174,809 B1 | 1/2001 | Kang et al. | 438/682 |
| 6,178,660 B1 | 1/2001 | Emmi et al. | 34/412 |
| 6,182,603 B1 | 2/2001 | Shang et al. | 118/723 MF |
| 6,192,827 B1 | 2/2001 | Welch et al. | 118/723 E |
| 6,193,802 B1 | 2/2001 | Pang et al. | 118/715 |
| 6,194,628 B1 | 2/2001 | Pang et al. | 118/715 |
| 6,197,119 B1 | 3/2001 | Dozoretz et al. | 118/715 |
| 6,200,415 B1 | 3/2001 | Maraschin | 156/345.52 |
| 6,203,613 B1 | 3/2001 | Gates et al. | 117/104 |
| 6,206,972 B1 | 3/2001 | Dunham | 118/715 |
| 6,210,754 B1 | 4/2001 | Lu et al. | 427/248.1 |
| 6,211,033 B1 | 4/2001 | Sandhu et al. | 438/387 |
| 6,211,078 B1 | 4/2001 | Matthews | 438/669 |
| 6,214,714 B1 | 4/2001 | Wang et al. | 438/592 |
| 6,237,394 B1 | 5/2001 | Harris et al. | 73/1.88 |
| 6,237,529 B1 | 5/2001 | Spahn | 118/726 |
| 6,245,192 B1 | 6/2001 | Dhindsa et al. | 156/345.34 |
| 6,255,222 B1 | 7/2001 | Xia et al. | 438/710 |
| 6,263,829 B1 | 7/2001 | Schneider et al. | 118/723 I |
| 6,270,572 B1 | 8/2001 | Kim et al. | 117/93 |
| 6,280,584 B1 | 8/2001 | Kumar et al. | 204/298.15 |
| 6,287,965 B1 | 9/2001 | Kang et al. | 438/648 |
| 6,287,980 B1 | 9/2001 | Hanazaki et al. | 438/726 |
| 6,290,491 B1 | 9/2001 | Shahvandi et al. | 432/5 |
| 6,291,337 B1 | 9/2001 | Sidhwa | 438/627 |
| 6,297,539 B1 | 10/2001 | Ma et al. | 257/410 |
| 6,302,964 B1 | 10/2001 | Umotoy et al. | 118/715 |
| 6,302,965 B1 | 10/2001 | Umotoy et al. | 118/715 |
| 6,303,953 B1 | 10/2001 | Doan et al. | 257/296 |
| 6,305,314 B1 | 10/2001 | Sneh et al. | 118/723 R |
| 6,309,161 B1 | 10/2001 | Hofmeister | 414/221 |
| 6,315,859 B1 | 11/2001 | Donohoe | 156/345.26 |
| 6,329,297 B1 | 12/2001 | Balish et al. | 438/714 |
| 6,342,277 B1 | 1/2002 | Sherman | 827/562 |
| 6,346,477 B1 | 2/2002 | Kaloyeros et al. | 438/68 A |
| 6,347,602 B1 | 2/2002 | Goto et al. | 118/723 MW |
| 6,347,918 B1 | 2/2002 | Blahnik | 414/217 |
| 6,355,561 B1 | 3/2002 | Sandhu et al. | 438/676 |
| 6,358,323 B1 | 3/2002 | Schmitt et al. | 118/726 |
| 6,374,831 B1 | 4/2002 | Chandran et al. | 134/1.1 |
| 6,387,185 B1 | 5/2002 | Doering et al. | 118/729 |
| 6,387,207 B1 | 5/2002 | Janakiraman et al. | 156/345 |
| 6,419,462 B1 | 7/2002 | Horie et al. | 417/394 |

| | | | | | | |
|---|---|---|---|---|---|---|
| 6,420,230 B1 | 7/2002 | Derderian et al. ......... 438/255 | | 2003/0013320 A1 | 1/2003 | Kim et al. .................. 438/778 |
| 6,420,742 B1 | 7/2002 | Ahn et al. .................. 257/295 | | 2003/0023338 A1 | 1/2003 | Chin et al. .................. 700/121 |
| 6,428,859 B1 | 8/2002 | Chiang et al. ............. 427/457 | | 2003/0024477 A1 | 2/2003 | Okuda et al. ......... 118/723 IR |
| 6,432,256 B1 | 8/2002 | Raoux ..................... 156/345.1 | | 2003/0027428 A1 | 2/2003 | Ng et al. ..................... 438/706 |
| 6,432,259 B1 | 8/2002 | Noorbaksh et al. .... 156/345.33 | | 2003/0027431 A1 | 2/2003 | Sneh et al. ................. 438/758 |
| 6,432,831 B1 | 8/2002 | Dhindsa et al. ............. 438/710 | | 2003/0037729 A1 | 2/2003 | DeDontney et al. ........ 118/715 |
| 6,435,865 B1 | 8/2002 | Tseng et al. ................ 432/152 | | 2003/0060030 A1 | 3/2003 | Lee et al. .................... 438/517 |
| 6,444,039 B1 | 9/2002 | Nguyen ...................... 118/715 | | 2003/0066483 A1 | 4/2003 | Lee et al. ..................... 118/715 |
| 6,450,117 B1 | 9/2002 | Murugesh et al. ... 118/723 ME | | 2003/0070609 A1 | 4/2003 | Campbell et al. ........... 118/715 |
| 6,451,119 B1 | 9/2002 | Sneh et al. ................... 118/715 | | 2003/0070617 A1 | 4/2003 | Kim et al. ................... 118/715 |
| 6,458,416 B1 | 10/2002 | Derderian et al. ......... 427/301 | | 2003/0070618 A1 | 4/2003 | Campbell et al. ........... 117/104 |
| 6,461,436 B1 | 10/2002 | Campbell et al. ........... 118/715 | | 2003/0075273 A1 | 4/2003 | Kilpela et al. ......... 156/345.33 |
| 6,461,931 B1 | 10/2002 | Eldridge ...................... 438/398 | | 2003/0079686 A1 | 5/2003 | Chen et al. .................. 118/715 |
| 6,503,330 B1 | 1/2003 | Sneh et al. ................... 118/715 | | 2003/0098372 A1 | 5/2003 | Kim .......................... 239/548 |
| 6,506,254 B1 | 1/2003 | Bosch et al. ................. 118/715 | | 2003/0098419 A1 | 5/2003 | Ji et al. ...................... 290/373 |
| 6,509,280 B1 | 1/2003 | Choi ........................... 438/778 | | 2003/0106490 A1 | 6/2003 | Jallepally et al. ............. 117/89 |
| 6,534,007 B1 | 3/2003 | Blonigan et al. .............. 422/62 | | 2003/0121608 A1 | 7/2003 | Chen et al. ............. 156/345.33 |
| 6,534,395 B1 | 3/2003 | Werkhoven et al. ......... 438/627 | | 2003/0159780 A1 | 8/2003 | Carpenter et al. ...... 156/345.31 |
| 6,540,838 B1 | 4/2003 | Sneh et al. ................... 118/715 | | 2003/0192645 A1 | 10/2003 | Liu ....................... 156/345.33 |
| 6,541,353 B1 | 4/2003 | Sandhu et al. ............... 438/478 | | 2003/0194862 A1 | 10/2003 | Mardian et al. ............. 438/680 |
| 6,551,929 B1 | 4/2003 | Kori et al. ................... 438/685 | | 2003/0200926 A1 | 10/2003 | Dando et al. ............. 427/248.1 |
| 6,562,140 B1 | 5/2003 | Bondestam et al. ........ 118/715 | | 2003/0203109 A1 | 10/2003 | Dando et al. ................ 118/719 |
| 6,562,141 B1 | 5/2003 | Clarke ......................... 118/719 | | 2004/0003777 A1 | 1/2004 | Carpenter et al. ........... 118/715 |
| 6,573,184 B1 | 6/2003 | Park ............................ 438/680 | | 2004/0007188 A1 | 1/2004 | Burkhart et al. ............ 118/733 |
| 6,579,372 B1 | 6/2003 | Park ............................ 118/715 | | 2004/0035358 A1 | 2/2004 | Basceri et al. ............... 118/715 |
| 6,579,374 B1 | 6/2003 | Bondestam et al. ........ 118/725 | | 2004/0040502 A1 | 3/2004 | Basceri et al. ............... 118/715 |
| 6,596,085 B1 | 7/2003 | Schmitt et al. .............. 118/726 | | 2004/0040503 A1 | 3/2004 | Basceri et al. ............... 118/715 |
| 6,602,346 B1 | 8/2003 | Gochberg .................... 118/715 | | 2004/0083959 A1 | 5/2004 | Carpemter et al. .......... 118/715 |
| 6,630,201 B1 | 10/2003 | Chiang et al. ......... 427/255.28 | | 2004/0083960 A1 | 5/2004 | Dando ......................... 118/715 |
| 6,635,965 B1 | 10/2003 | Lee et al. ..................... 297/758 | | 2004/0083961 A1 | 5/2004 | Basceri ........................ 118/715 |
| 6,638,672 B1 | 10/2003 | Deguchi ........................ 430/30 | | 2004/0099377 A1 | 5/2004 | Newton et al. ......... 156/345.33 |
| 6,638,879 B1 | 10/2003 | Hsieh et al. ................. 438/791 | | 2004/0124131 A1 | 7/2004 | Aitchison et al. ........... 210/252 |
| 6,641,673 B1 | 11/2003 | Yang ........................... 118/723 | | 2004/0154538 A1 | 8/2004 | Carpenter et al. ........... 118/719 |
| 6,673,196 B1 | 1/2004 | Oyabu ................... 156/345.31 | | 2004/0226507 A1 | 11/2004 | Carpenter et al. ........... 118/696 |
| 6,704,913 B1 | 3/2004 | Rossman ......................... 716/4 | | 2005/0016956 A1* | 1/2005 | Liu et al. ........................ 216/67 |
| 6,705,345 B1 | 3/2004 | Bifano ........................ 137/597 | | 2005/0016984 A1 | 1/2005 | Dando ......................... 219/390 |
| 6,706,334 B1 | 3/2004 | Kobayashi et al. .......... 427/534 | | 2005/0022739 A1 | 2/2005 | Carpenter et al. ........... 118/715 |
| 6,818,249 B1 | 11/2004 | Derderian ................. 427/248.1 | | 2005/0028734 A1 | 2/2005 | Carpenter et al. ........... 118/715 |
| 6,821,347 B1 | 11/2004 | Carpenter et al. ............... 427/8 | | 2005/0039680 A1 | 2/2005 | Beaman et al. .............. 118/715 |
| 6,838,114 B1 | 1/2005 | Carpenter et al. ........... 118/719 | | 2005/0039686 A1 | 2/2005 | Zheng et al. ................ 118/728 |
| 6,861,094 B1 | 3/2005 | Derderian et al. ........ 427/248.1 | | 2005/0045100 A1 | 3/2005 | Derderian ................... 118/715 |
| 2001/0010309 A1 | 8/2001 | Van Bilsen ................. 219/497 | | 2005/0045102 A1 | 3/2005 | Zheng et al. ................ 118/722 |
| 2001/0011526 A1 | 8/2001 | Doering et al. ............. 118/729 | | | | |
| 2001/0024387 A1 | 9/2001 | Raaijmakers et al. ....... 365/200 | | FOREIGN PATENT DOCUMENTS | | |
| 2001/0029892 A1 | 10/2001 | Cook et al. ............ 118/723 E | | | | |
| 2001/0045187 A1 | 11/2001 | Uhlenbrock ................ 118/715 | | EP | 1 167 569 A1 | 1/2002 |
| 2001/0054484 A1 | 12/2001 | Komino ................. 156/345.31 | | JP | 63-256460 A | 10/1988 |
| 2002/0007790 A1 | 1/2002 | Park ............................ 118/715 | | JP | 1-273991 A | 11/1989 |
| 2002/0020353 A1 | 2/2002 | Redemann et al. ......... 118/715 | | JP | 4-100533 A | 4/1992 |
| 2002/0043216 A1 | 4/2002 | Hwang et al. ........ 118/723 VE | | JP | 4-213818 A | 8/1992 |
| 2002/0052097 A1 | 5/2002 | Park ............................ 438/597 | | JP | 6-151558 A | 5/1994 |
| 2002/0073924 A1 | 6/2002 | Chiang et al. ............... 427/569 | | JP | 6-342785 A | 12/1994 |
| 2002/0076490 A1 | 6/2002 | Chiang et al. ............ 427/248.1 | | JP | 8-34678 A | 2/1996 |
| 2002/0076507 A1 | 6/2002 | Chiang et al. ............... 427/569 | | JP | 9-82650 A | 3/1997 |
| 2002/0076508 A1 | 6/2002 | Chiang et al. ........... 118/723 R | | JP | 10-223719 A | 8/1998 |
| 2002/0094689 A1 | 7/2002 | Park ............................ 438/694 | | JP | 11-172438 A | 6/1999 |
| 2002/0100418 A1 | 8/2002 | Sandhu et al. .............. 118/719 | | JP | 2001-82682 A | 3/2001 |
| 2002/0104481 A1 | 8/2002 | Chiang et al. ............ 118/723 I | | JP | 2001-261375 A | 9/2001 |
| 2002/0108714 A1 | 8/2002 | Doering et al. ......... 156/345.51 | | JP | 2002-164336 A | 6/2002 |
| 2002/0110991 A1 | 8/2002 | Li ............................... 438/347 | | JP | 2001-254181 A | 9/2002 |
| 2002/0127745 A1 | 9/2002 | Lu et al. ....................... 438/14 | | SU | 598630 | 3/1978 |
| 2002/0129768 A1 | 9/2002 | Carpemter et al. .......... 118/715 | | WO | WO-98/37258 A1 | 8/1998 |
| 2002/0144655 A1 | 10/2002 | Chiang et al. ............... 118/715 | | WO | WO-99/06610 A1 | 2/1999 |
| 2002/0146512 A1 | 10/2002 | Rossman ............... 427/255.28 | | WO | WO-00/40772 A1 | 7/2000 |
| 2002/0162506 A1 | 11/2002 | Sneh et al. ................... 118/715 | | WO | WO-00/63952 A1 | 10/2000 |
| 2002/0164420 A1 | 11/2002 | Derderian et al. ........ 427/248.1 | | WO | WO-00/65649 A1 | 11/2000 |
| 2002/0185067 A1 | 12/2002 | Upham ....................... 118/715 | | WO | WO-00/79019 A1 | 12/2000 |
| 2002/0195056 A1 | 12/2002 | Sandhu et al. .............. 118/719 | | WO | WO-01/46490 A1 | 6/2001 |
| 2002/0195201 A1 | 12/2002 | Beer ....................... 156/345.31 | | WO | WO-02/45871 A1 | 6/2002 |
| 2002/0197402 A1 | 12/2002 | Chiang et al. ........... 427/255.39 | | WO | WO-02/48427 A1 | 6/2002 |
| 2003/0000473 A1 | 1/2003 | Chae et al. ................... 118/715 | | WO | WO-02/073329 A2 | 9/2002 |
| 2003/0003697 A1 | 1/2003 | Agarwal et al. ............. 438/496 | | WO | WO-02/073660 A1 | 9/2002 |
| 2003/0003730 A1 | 1/2003 | Li ............................... 438/680 | | WO | WO-02/081771 A2 | 10/2002 |

| | | |
|---|---|---|
| WO | WO-02/095807 A2 | 11/2002 |
| WO | WO-03/008662 A2 | 1/2003 |
| WO | WO-03/016587 A1 | 2/2003 |
| WO | WO-03/028069 A2 | 4/2003 |
| WO | WO-03/033762 A1 | 4/2003 |
| WO | WO-03/035927 A2 | 5/2003 |
| WO | WO-03/052807 A1 | 6/2003 |

OTHER PUBLICATIONS

U.S. Appl. No. 11/027,825, filed Dec. 29, 2004, Derderian et al.
U.S. Appl. No. 10/933,604, filed Sep. 2, 2004, Carpenter et al.
U.S. Appl. No. 10/687,458, filed Oct. 15, 2003, Kubista et al.
U.S. Appl. No. 10/683,424, filed Oct. 10, 2003, Mardian.
U.S. Appl. No. 10/839,316, filed May 5, 2004, Saragiannis et al.
U.S. Appl. No. 10/814,573, filed Mar. 31, 2004, Gealy et al.
U.S. Appl. No. 11/043,629, filed Jan. 25, 2005, Rueger et al.
U.S. Appl. No. 11/018,142, filed Dec. 20, 2004, Rueger et al.
U.S. Appl. No. 10/840,571, filed May 6, 2004, Dando et al.
U.S. Appl. No. 10/859,883, filed Jun. 2, 2004, Miller et al.
U.S. Appl. No. 10/683,606, filed Oct. 9, 2003, Derderian.
U.S. Appl. No. 10/733,523, filed Oct. 10, 2003, Beaman et al.
U.S. Appl. No. 10/767,298, filed Jan. 28, 2004, Zheng et al.
U.S. Appl. No. 11/027,809, filed Dec. 29, 2004, Carpenter et al.
U.S. Appl. No. 09/651,037, filed Aug. 30, 2000, Mardian.
U.S. Appl. No. 10/365,085, filed Feb. 11, 2003, Carpenter et al.
U.S. Appl. No. 10/665,908, filed Sep. 18, 2003, Sarigiannis et al.
Integrated Process Systems Ltd., "ALD & CVD", 2 pages, retrieved from the internet on Dec. 11, 2001, <http://www.ips-tech.com/eng/pro-p2-2.htm>.
Deublin Company, "Rotating Unions", 1 page, retrieved from the Internet on Feb. 4, 2002, <http://www.com/products/rotatingunions.htm>.
Cameron, I., "Atomic Layer Deposition Chamber Works at Low Temperatures", 2 pages, Electronic Times, Jul. 19, 2001, <http://www.electronictimes.com/story/OEG20010719S0042>.
Cutting Edge Optronics, 600W QCW Laser Diode Array, Part No. ARR48P600, 2 pages, Oct. 2001, <www.ceolaser.com>.
Henning, A.K., et al., "Microfluidic MEMS for Semiconductor Processing," IEEE Trans. Components, Packaging, and Manufacturing Technology B21, pp. 329-337, 1998.
Fitch, J.S., et al., "Pressure-Based Mass-Flow Control Using Thermopneumatically-Actuacted Microvalves," Proceedings, Sensors and Actuators Workshop, pp. 162-165 (Transducers Research Foundation; Cleveland, OH, 1998).
Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.
Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).
Maillefer, D., et al., "A High-Performance Silicon Micropump for Disposable Drug Delivery Systems," pp. 413-417, IEEE, 2001.
Henning, A.K., et al., "A thermopneumatically actuated microvalve for liquid expansion and proportional control", Proceedings, TRANSDUCERS '97: 1997 International Solid State Sensors and Actuators Conference, pp. 825-828.
University of California, Berkeley, University Extension, "Atomic Layer Deposition," 5 pages, Sep. 24-25, 2001, <http://www.unex.berkeley.edu/eng/br225/1-1.html>.
Engelke, F., et al., "Determination of Phenylthiohydantoin-Amino Acids by Two-Step Laser Sesorption/Multiphoton Ionization," Analytical Chemistry, vol. 59, No. 6, pp. 909-912, Mar. 15, 1987, The American Chemical Society.
Cowin, J.P., et al., "Measurement of Fast Desorption Kinetics of D2 From Tungsten By Laser Induced Thermal Desorption," Surface Science, vol. 78, pp. 545-564, 1978, North-Holland Publishing Company.
Ready, J.F., "Effects Due to Absorption of Laser Radiation," Journal of Applied Physics, vol. 36, No. 2, pp. 462-468, Feb. 1965, Journal of Applied Physics, American Institute of Physics.
Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.
Tokyo Electron Limited, Plasma System, Trias SPA, 1 page, retrieved from the Internet on Oct. 16, 2004, <http://www.tel.com/eng/products/spe/sdtriasspa.htm>.
Olsson, A., "Valve-less Diffuser Micropumps", ISSN 0281-2878, 66 pages, 1998.
Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.
Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.
Henning, A.K. et al., "Contamination Reduction Using MEMS-BASED, High-Precision Mass Flow Controllers," Proceedings, SEMICON West Symposium on Contamination Free Manufacturing for Semiconductor Processing (SEMI, Mountain View, CA, 1998), pp. 1-11.
Henning, A.K., "Microfluidic MEMS," Proceedings, IEEE Aerospace Conference, Paper 4.906 (IEEE Press, Piscataway, NJ, 1998), 16 pages.
Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.
The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.
Deublin Company, "Sealing," 2 pages, retrieved from the Internet on Feb. 4, 2002, <http://www.deublin.com/products/sealing.htm>.
Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.
Integrated Process Systems Ltd., "Nano-ALD", 2 pages, retrieved from the Internet on Dec. 11, 2001, <http://www.ips-tech.com/eng/pro-p2.htm>.
Integrated Process Systems Ltd., "Welcome to IPS Ltd.", 1 page, retrieved from the Internet on Dec. 11, 2001, <http://www.ips-tech.com/eng/main.htm>.

* cited by examiner

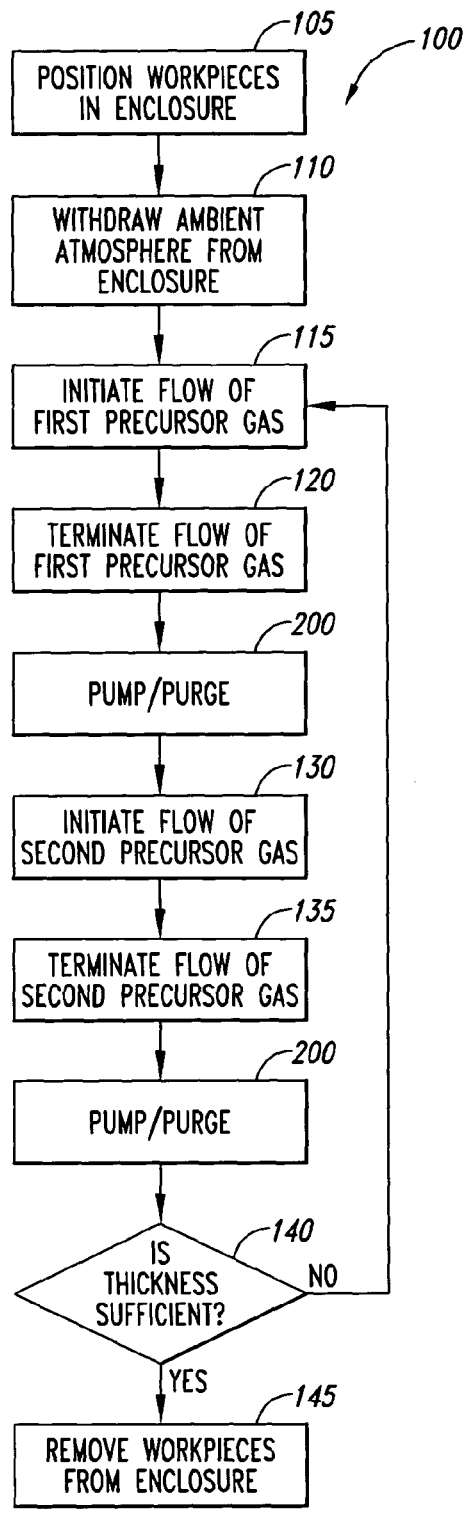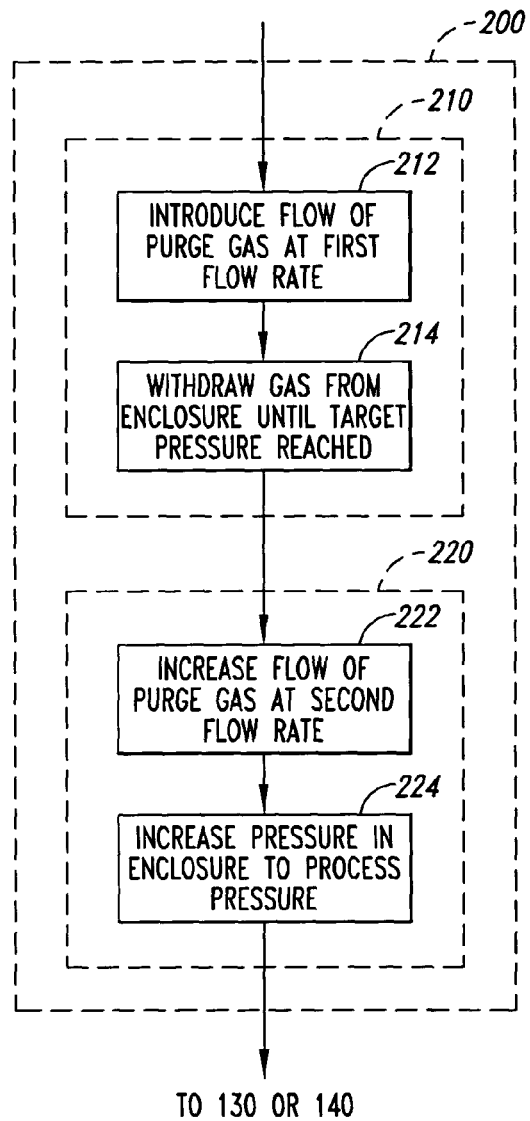
Fig. 4
Fig. 5

MICROFEATURE WORKPIECE PROCESSING APPARATUS AND METHODS FOR CONTROLLING DEPOSITION OF MATERIALS ON MICROFEATURE WORKPIECES

TECHNICAL FIELD

The present invention is related to equipment and methods for processing microfeature workpieces, e.g., semiconductor wafers. Aspects of the invention have particular utility in connection with batch deposition of materials on microfeature workpieces by atomic layer deposition.

BACKGROUND

Thin film deposition techniques are widely used in the manufacturing of microfeatures to form a coating on a workpiece that closely conforms to the surface topography. In the context of microelectronic components, for example, the size of the individual components in the devices on a wafer is constantly decreasing, and the number of layers in the devices is increasing. As a result, the density of components and the aspect ratios of depressions (e.g., the ratio of the depth to the size of the opening) are increasing. The size of such wafers is also increasing to provide more real estate for forming more dies (i.e., chips) on a single wafer. Many fabricators are currently transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is chemical vapor deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a solid thin film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within silicon workpieces at higher temperatures. On the other hand, if more reactive precursors are used so that the workpiece temperature can be lower, then reactions may occur prematurely in the gas phase before reaching the intended surface of the workpiece. This is undesirable because the film quality and uniformity may suffer, and also because it limits the types of precursors that can be used.

Atomic layer deposition (ALD) is another thin film deposition technique. FIGS. 1A and 1B schematically illustrate the basic operation of ALD processes. Referring to FIG. 1A, a layer of gas molecules A coats the surface of a workpiece W. The layer of A molecules is formed by exposing the workpiece W to a precursor gas containing A molecules, and then purging the chamber with a purge gas to remove excess A molecules. This process can form a monolayer of A molecules on the surface of the workpiece W because the A molecules at the surface are held in place during the purge cycle by physical adsorption forces at moderate temperatures or chemisorption forces at higher temperatures. The layer of A molecules is then exposed to another precursor gas containing B molecules. The A molecules react with the B molecules to form an extremely thin layer of solid material C on the workpiece W. The chamber is then purged again with a purge gas to remove excess B molecules.

FIG. 2 illustrates the stages of one cycle for forming a thin solid layer using ALD techniques. A typical cycle includes (a) exposing the workpiece to the first precursor A, (b) purging excess A molecules, (c) exposing the workpiece to the second precursor B, and then (d) purging excess B molecules. The purge process typically comprises introducing a purge gas, which is substantially non-reactive with either precursor, and exhausting the purge gas and excess precursor from the reaction chamber in a pumping step. In actual processing, several cycles are repeated to build a thin film on a workpiece having the desired thickness. For example, each cycle may form a layer having a thickness of approximately 0.5–1.0 Å, and thus it takes approximately 60–120 cycles to form a solid layer having a thickness of approximately 60 Å.

One drawback of ALD processing is that it has a relatively low throughput compared to CVD techniques. For example, ALD processing typically takes several seconds to perform each A-purge-B-purge cycle. This results in a total process time of several minutes to form a single thin layer of only 60 Å. In contrast to ALD processing, CVD techniques only require about one minute to form a 60 Å thick layer. In single-wafer processing chambers, ALD processes can be 500%–2000% longer than corresponding single-wafer CVD processes. The low throughput of existing single-wafer ALD techniques limits the utility of the technology in its current state because ALD may be a bottleneck in the overall manufacturing process.

One promising solution to increase the throughput of ALD processing is processing a plurality of wafers (e.g., 20–250) simultaneously in a batch process. As suggested in International Publication No. WO 02/095807, the entirety of which is incorporated herein by reference, such batch processes typically stack the plurality of wafers in a wafer holder that is positioned in an enclosure of a processing system. To increase the number of wafers that can be treated at one time and concomitantly increase the throughput of the system, the wafers are typically held in a relatively close spaced-apart relationship. Unfortunately, this close spacing between adjacent wafers hinders the flow of gas adjacent the surface of the wafer, particularly adjacent the center of each wafer.

In conventional single-wafer ALD systems, a gas "showerhead" will be spaced in relatively close, parallel proximity with substantially the entirety of the wafer surface. This facilitates thorough, effective purging of the excess precursors A and B. In a batch ALD system, however, gas is typically introduced to flow longitudinally alongside the wafer holder. As a consequence, gas exchange between the wafers takes place, in large part, by gas diffusion rather than a significant flow rate of gas across the wafer surface. To enhance the removal of excess precursor between the wafers, conventional batch ALD processing typically involves introducing a significant quantity of a purge gas to dilute the remaining precursor, then drawing a vacuum on the enclosure to remove the diluted gas. Unfortunately, this addition of excess purge gas and subsequent pump-down can take a relatively long period of time, further reducing the throughput of the batch ALD processing system.

BRIEF DESCRIPTION OF THE DRAWINGS

FIG. 4 is a schematic flow diagram illustrating aspects of a method in accordance with one embodiment of the invention.

FIG. 5 is a flow diagram schematically illustrating aspects of one embodiment of the pump/purge steps in FIG. 4.

DETAILED DESCRIPTION

A. Overview

Figure 1A:
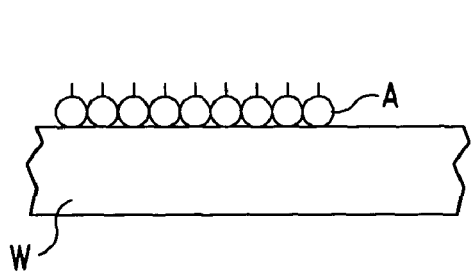
FIGS. 1A and 1B are schematic cross-sectional views of stages in ALD processing in accordance with the prior art.
Figure 1B:
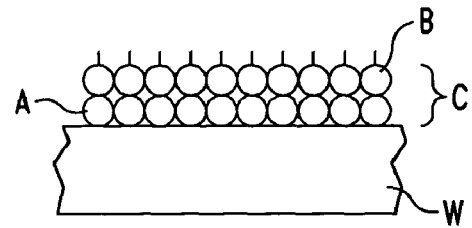
Figure 2:
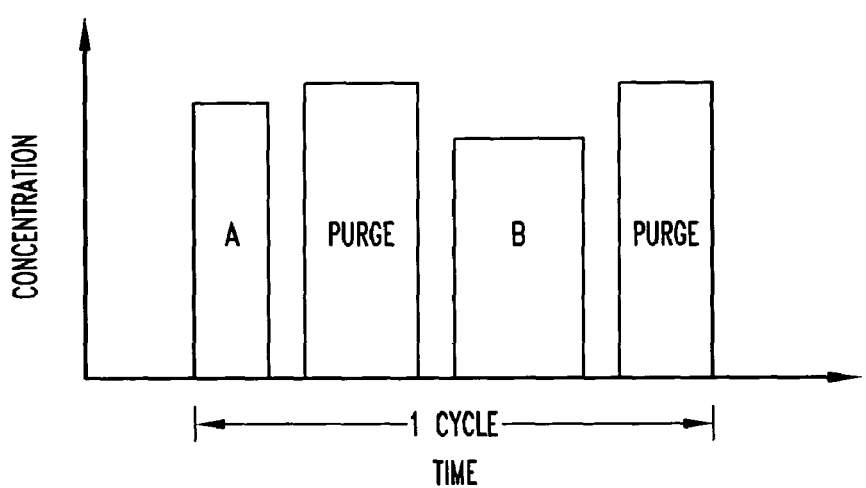
FIG. 2 is a graph illustrating a cycle for forming a layer using ALD techniques in accordance with the prior art.

Various embodiments of the present invention provide microfeature workpiece holders, systems including processing chambers, and methods for depositing materials onto microfeature workpieces. Many specific details of the invention are described below with reference to reactors for depositing materials onto microfeature workpieces. The term "microfeature workpiece" is used throughout to include substrates upon which and/or in which microelectronic devices, micromechanical devices, data storage elements, read/write components, and other devices are fabricated. For example, microfeature workpieces can be semiconductor wafers such as silicon or gallium arsenide wafers, glass substrates, insulative substrates, and many other types of materials. The microfeature workpieces typically have submicron features with dimensions of 0.05 microns or greater. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 3–6 and the following text to provide a thorough understanding of particular embodiments of the invention. A person skilled in the art will understand, however, that the invention may have additional embodiments, or that the invention may be practiced without several of the details of the embodiments shown in FIGS. 3–6.

One embodiment of the invention provides a method of depositing a material on a microfeature workpiece. In accordance with this method, a plurality of microfeature workpieces are positioned in a spaced relationship within an enclosure. A flow of a first precursor gas is introduced to the enclosure at a first enclosure pressure. The flow of the first precursor is terminated and pressure within the enclosure is reduced to a second enclosure pressure while introducing a flow of a purge gas at a first flow rate. The processing system has a base pressure at the first flow rate. A difference between the second enclosure pressure and the first enclosure pressure is at least 90 percent of the difference between the base pressure and the first enclosure pressure. After reducing the pressure within the enclosure to the second enclosure pressure, the flow rate of the purge gas is increased to a second flow rate and the pressure within the enclosure is increased to a third enclosure pressure. After increasing the pressure within the enclosure to the third enclosure pressure, a flow of a second precursor gas is introduced to the enclosure at a fourth enclosure pressure. The third and fourth enclosure pressures may be substantially the same, with any difference between the third and fourth enclosure pressures being about 0–10 percent of the fourth enclosure pressure.

A method in accordance with another embodiment of the invention may also be used to deposit a material on a microfeature workpiece. In this method, a plurality of microfeature workpieces, each of which has a surface, is positioned within an enclosure. The surfaces of the microfeature workpieces are exposed to a first precursor gas at a first enclosure pressure to allow at least a monolayer of the first precursor gas to be adsorbed on the surfaces of the microfeature workpieces. Pressure within the enclosure is reduced to a second, lower enclosure pressure via a pump-down process. The pump-down process comprises withdrawing gas from the enclosure, e.g., with a vacuum, while introducing a purge gas at a first flow rate of no greater than about 250 sccm for a first period of time. This pump-down process reduces the partial pressure of the first precursor gas within the enclosure. After the pump-down process, the enclosure is purged in a purge process that includes introducing the purge gas at a second flow rate of at least about 1000 sccm for a second period of time and allowing the enclosure pressure to increase to a third enclosure pressure that is greater than the second enclosure pressure. After the purge process, the surfaces of the microfeature workpieces may be exposed to a second precursor gas at a fourth enclosure pressure. The third and fourth enclosure pressures may be substantially the same, with any difference between the third and fourth enclosure pressures desirably being about 0–10 percent of the fourth enclosure pressure.

Another embodiment of the invention provides a microfeature workpiece processing system that includes an enclosure, a gas supply, a vacuum, and a programmable controller. The enclosure is adapted to receive a plurality of microfeature workpieces for simultaneous treatment. The gas supply is adapted to selectively deliver a first gaseous precursor, a second gaseous precursor, and a purge gas to the enclosure. The programmable controller is operatively coupled to the gas supply and the vacuum, and the controller may be programmed to carry out one of the aforementioned methods or methods in accordance with other aspects of the invention.

For ease of understanding, the following discussion is subdivided into two areas of emphasis. The first section discusses microfeature workpiece processing systems in accordance with selected embodiments of the invention. The second section outlines methods in accordance with other aspects of the invention.

B. Microfeature Workpiece Processing Systems

Figure 3:
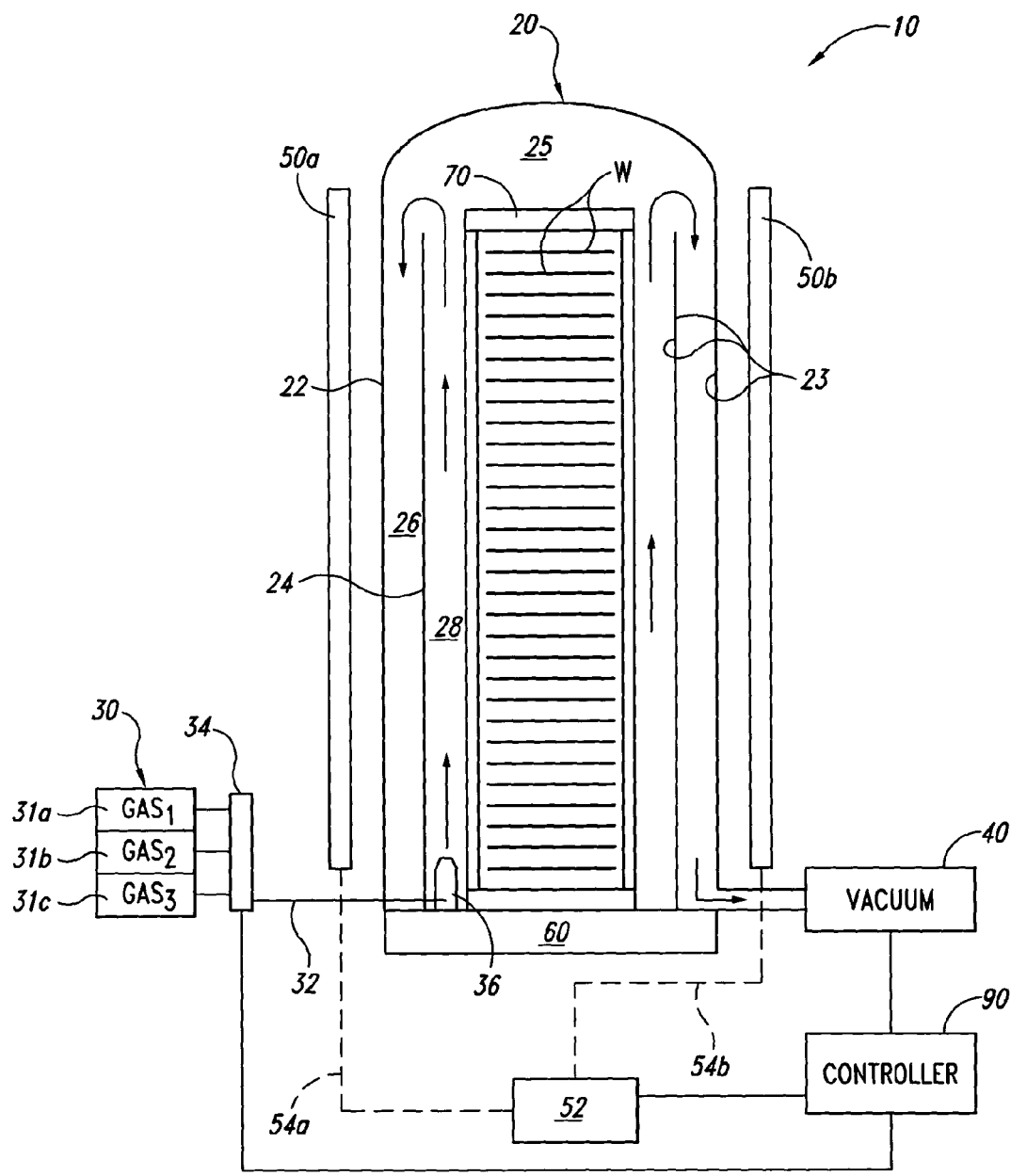
FIG. 3 is a schematic cross-sectional view of a microfeature workpiece processing system in accordance with an embodiment of the invention.

FIG. 3 schematically illustrates a reactor 10 in accordance with one embodiment of the invention. This reactor 10 includes a processing enclosure 20 coupled to a gas supply 30 and a vacuum 40. The processing enclosure 20 generally includes an outer wall 22 and an annular liner 24. A platform 60 seals against the outer wall or some other part of the processing enclosure 20 to define a deposition chamber 25. The liner 24 functionally divides the deposition chamber 25 into a main chamber 28 and an annular exhaust 26.

One or more microfeature workpieces W, e.g., semiconductor wafers, may be positioned in the deposition chamber 25 for processing. In the illustrated embodiment, a plurality of microfeature workpieces W are held in the processing enclosure 20 in a workpiece holder 70. It should be understood that FIG. 3 is merely schematic in nature and any number (e.g., 20–250) of workpieces W may be held in the workpiece holder 70 for simultaneous batch processing.

The reactor 10 also includes at least one heat source to heat the workpieces W and maintain them at the desired temperature. The heat source in FIG. 3 is typified as a radiant heater 50 comprising a series of radiant heat panels 50a and 50b arranged about a circumference of the enclosure 20 to evenly heat the workpieces W. In one embodiment, these heat panels 50a–b comprise quartz-halogen lamps or other types of radiative heat sources. In other embodiments, other types of heat sources may be employed. The heater 50 may also include a power supply 52 that is coupled to the first heat panel 50a by a first power line 54a and to the second heat panel 50b by a second power line 54b.

Gas is introduced from the gas supply 30 to the deposition chamber 25 by a gas line 32 and an inlet 36. The inlet 36 directs a flow of gas into the main chamber 28 of the deposition chamber 25. Under influence of the vacuum 40, gas introduced via the gas inlet 36 will flow through the main chamber 28, outwardly into the annular exhaust 26, and out of the deposition chamber 25. A valve assembly 34 in the gas line 32 may be operated by a controller 90 to selectively deliver gases to the deposition chamber 25 during the deposition phase. In one embodiment, the controller 90 comprises a computer having a programmable processor programmed to control operation of the reactor 10 to deposit material on the workpieces W in accordance with one or more of the methods outlined below. The controller 90 may be coupled to the vacuum 40 to control its operation. The controller 90 may also be operatively connected to the heater 50, e.g., via the power supply 52, to control the temperature of the workpieces W.

Some aspects of the gas supply 30 will depend on the nature of the deposition process to be carried out in the reactor 10. In one embodiment, the reactor 10 is adapted to carry out an ALD process employing multiple precursors. The gas supply 30 in such embodiments can include a plurality of separate gas sources 31a–c, and the valve assembly 34 may have a plurality of valves. For example, the gas supply 30 may include one or more gaseous precursors capable of reacting to deposit titanium nitride. In one such implementation, the first gas source 31a is adapted to deliver $TiCl_4$, the second gas source 31b is adapted to deliver $NH_3$, and the third gas source 31c is adapted to deliver a flow of a purge gas, e.g., nitrogen.

C. Methods of Depositing Materials On Microfeature Workpieces

As noted above, other embodiments of the invention provide methods of processing microfeature workpieces. In the following discussion, reference is made to the particular microfeature workpiece processing system 10 shown in FIG. 3. It should be understood, though, that reference to this particular processing system is solely for purposes of illustration and that the methods outlined below are not limited to any particular processing system shown in the drawings or discussed in detail above.

FIGS. 4 and 5 schematically illustrate aspects of a method of depositing a material on surfaces of a batch of microfeature workpieces in accordance with one embodiment of the invention; FIG. 4 provides an overview, whereas FIG. 5 provides details of certain aspects of FIG. 4. Turning first to FIG. 4, the workpiece manufacturing process 100 may be initiated by positioning the workpieces W in the enclosure 20 of an ALD reactor 10 or other processing system (process 105). In process 110, the ambient atmosphere that entered the main chamber 25 of the enclosure 20 may be withdrawn, e.g., by means of the vacuum 40 and a flow of an inert purge gas (e.g., nitrogen from the third gas source 31c of the gas supply 30). If necessary, the workpieces W may also be heated to the desired process temperature by the heaters 50.

With the majority of any deleterious gases removed from the deposition chamber 25, a flow of the first precursor gas may be initiated in process 115 and terminated in process 120. This will deliver a pulse of the first precursor gas into the deposition chamber 25, exposing a surface of each of the workpieces W in the deposition chamber 25 to the first precursor. The first precursor may be at least chemisorbed on the workpiece W. Theoretically, such chemisorption will form a monolayer that is uniformly one molecule thick on the entire surface of the workpiece W. Such a monolayer may be referred to as a saturated monolayer. As a practical matter, in some circumstances some minor portions of the workpiece surface may not chemisorb a molecule of the precursor. Nevertheless, such imperfect monolayers are still referred to herein as monolayers. In many applications, a substantially saturated monolayer may be suitable. A substantially saturated monolayer is a monolayer that will yield a deposited layer exhibiting the requisite quality and/or performance parameters.

As is known in the art, an excess of the first precursor gas is typically delivered to the processing enclosure 20. This excess first precursor gas is desirably removed from the vicinity of the workpiece surface prior to introduction of the second precursor gas. Inadequate removal of the first precursor gas prior to introduction of the second precursor gas may result in a gaseous phase reaction between the precursors that yields a material that is less conformal to the topography of the workpiece surface or otherwise adversely affects the quality of the deposited material. Consequently, in the manufacturing process 100 of FIG. 4, a pump/purge process 200 (detailed below) is carried out before introducing the second precursor gas to the enclosure 20. After the pump/purge process 200, a flow of the second precursor gas may be initiated in process 130 to deliver a pulse of the second precursor gas to the enclosure 20. This second precursor may chemisorb on the first monolayer of the first precursor and/or react with the monolayer to form a reaction product. This reaction product is typically one or no more than a few molecules thick, yielding a very thin, highly conformal nanolayer reaction product. After a suitable exposure to the second gaseous precursor, the flow of the second precursor gas may be terminated in process 135 and a pump/purge process 200 may again be performed.

This series of first precursor—pump/purge—second precursor—pump/purge processes may be considered one ALD cycle adapted to deposit a single nanolayer of material. As noted above, the ALD process may need to be repeated a number of times to deposit a layer of material having an appropriate thickness. The manufacturing process 100 of FIG. 4 may thus include a decision process 140 that decides whether the layer deposited on the microfeature workpieces W is thick enough. In many circumstances, this decision will comprise determining whether a fixed number of deposition cycles, which has been empirically determined to deposit an adequate thickness, has been performed. If a sufficient thickness has not been deposited, the manufacturing process 100 may return to process 115 to deposit another thickness of the reaction product. If the thickness is determined in process 140 to be sufficient, though, the workpieces W may be removed from the enclosure 20 in process 145.

FIG. 5 schematically illustrates the pump/purge process 200 of FIG. 4 in greater detail. This pump/purge process 200 generally includes a pump process 210 and a purge process 220. The pump process 210 may include introducing a flow of purge gas at a first flow rate (process 212) and withdrawing gas from the enclosure 20 until a target pressure is reached (process 214). If the vacuum system 40 of the reactor 10 is sufficiently robust, it may be possible to omit the flow of purge gas in process 212 and instead merely withdraw gas from the enclosure 20 with the vacuum 40 in process 214. This will reduce the pressure within the enclosure 20 more rapidly, reducing the time necessary for the pump process 210. For many commercial reactors 10, however, it may be advantageous to continue a flow of purge gas at a relatively low flow rate to reduce the chances of any backflow from or cross-contamination in the vacuum 40.

The first flow rate suitable in process 212 will depend in part on the design of the reactor 10, including its size and geometry, and the precursor being removed. In many commercial applications, though, a first flow rate of no greater than about 250 standard cubic centimeters per minute (sccm) will suffice. A flow rate of 0–250 sccm will be appropriate for most applications, but a flow rate of 50–250 sccm, e.g., 50–100 sccm, is preferred for select embodiments. The particular embodiment illustrated in FIG. 5 shows the introduction of the purge gas in process 212 before withdrawing gas from the enclosure in process 214. In other embodiments, the order of processes 212 and 214 may be reversed or processes 212 and 214 may start and end simultaneously.

After the pump process 210, the pump/purge process 200 of FIG. 5 continues with the purge process 220. This purge process 220 includes increasing the flow of purge gas to a second flow rate in process 222 and increasing pressure in the enclosure 20 to a process pressure 224 that is higher than the target pressure in process 214. In one embodiment, the second flow rate in process 222 is at least about four times the first flow rate (process 212), though this multiple may be significantly higher. It is anticipated that a second flow rate of at least 1000 sccm will be best in most circumstances. In embodiments employing commercial-scale batch ALD reactors 10, a second flow rate of no less than 2000 sccm may be advantageous.

Figure 6:
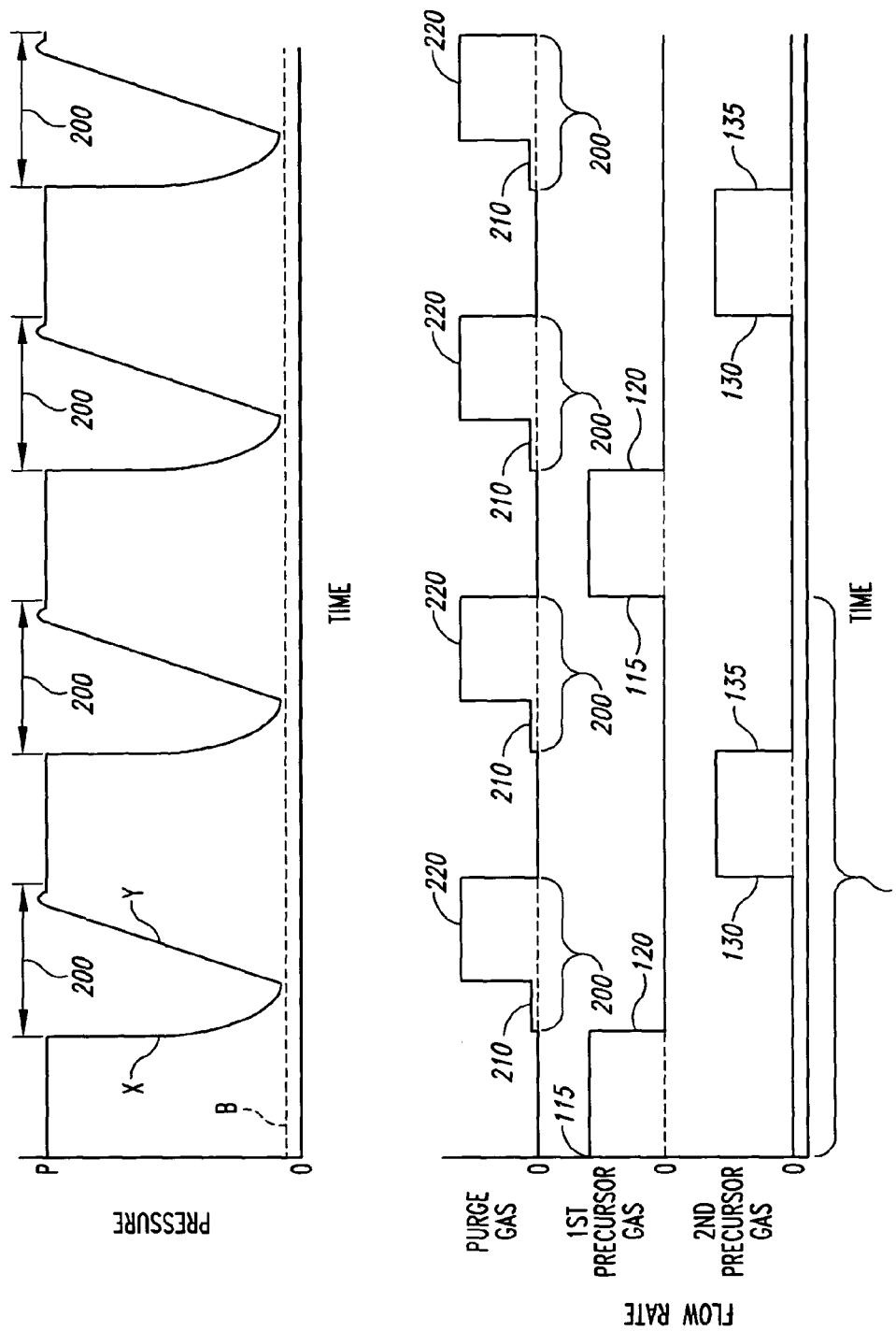
FIG. 6 is a graph schematically illustrating gas pressures and flow rates in accordance with one particular embodiment of the invention.

FIGS. 4 and 5 provide an overview of the manufacturing process 100. FIG. 6 provides a schematic illustration of one particular implementation of the manufacturing process 100 that highlights some of the aspects and advantages of select embodiments of the invention. The upper graph of FIG. 6 illustrates the pressure in the processing enclosure 20 over the course of part of the manufacturing process 100. The bottom graph of FIG. 6 is a schematic plot of the flow rate of a purge gas, a first precursor gas, and a second precursor gas as a function of time. The time scale in both graphs of FIG. 6 is the same.

The timeline of FIG. 6 starts with the initiation of the flow of the first precursor gas in process 115 of FIG. 4. (Like reference numbers are used in FIGS. 4–6 to indicate like processes.) The flow of the first precursor gas will continue until it is terminated in process 120, whereupon the pump/purge process 200 may begin. As shown in the top graph of FIG. 6, the pressure in the main chamber 28 of the enclosure 20 may remain substantially constant at a selected process pressure P during the first precursor gas pulse. The process pressure P will vary depending on the nature of the deposition process being carried out, e.g., the nature of the first and second precursor gases, the temperature of the workpieces W, the volume and dimensions of the enclosure 20, and other operating parameters.

As noted above, the pump/purge process 200 includes a pump-down process 210 and a purge process 220. In the pump-down process 210, the flow of purge gas may be relatively low, e.g., 50–100 sccm. With the vacuum 40 activated, the pressure in the main chamber 28 of the enclosure will drop fairly rapidly, as suggested by curve X in the upper graph of FIG. 6. For any particular reactor 10 design and first flow rate during the pump-down process 210, the main chamber 28 of the enclosure 20 will have a substantially steady-state lower pressure identified in FIG. 6 as base pressure B.

In the purge process 220, the flow rate of the purge gas is increased and the pressure within the main chamber 28 of the enclosure 20 is allowed to increase (curve Y). In one particular embodiment, the enclosure pressure at the end of the purge process 220 is similar to the process pressure P at which the workpieces W will be exposed to the second precursor gas. In one particular embodiment, a difference between the enclosure pressure at the end of the purge process 220 and the desired process pressure P at which the workpieces W will be exposed to the second precursor gas is about 0–10% of the process pressure P. In the particular scenario illustrated in the top graph of FIG. 6, the pressure in the enclosure may slightly exceed the process pressure P, but be brought back down to the process pressure P by the end of the pump/purge process 200. If the flow of the second precursor gas were initiated in process 130 when the enclosure pressure is at or close to the base pressure B, the controller 90 is likely to overshoot the desired process pressure P before stabilizing the enclosure pressure. Overshooting the process pressure P with the flow of the second precursor can introduce undesirable variations in the exposure of the workpieces W to the second precursor gas from one cycle to the next. By increasing the enclosure pressure during the purge process 220, the likelihood of overshooting the process pressure P with the second precursor gas can be materially reduced. In the particular scenario illustrated in FIG. 6, the enclosure pressure may overshoot the process pressure P during the purge process 220, but the enclosure pressure may be substantially stabilized at the process pressure P before the flow of the second precursor gas is initiated in process 130. This can enhance uniformity of the process from one cycle to the next.

One objective of the pump/purge process 200 is to reduce the concentration of any excess, nonadsorbed precursor gas in at least the main chamber 28 of the enclosure 20 to an acceptable level. The first precursor—pump/purge—second precursor—pump/purge cycle typically must be repeated numerous times to deposit a suitable thickness of material on the surfaces of the workpieces W. Reducing the time of the pump/purge process 200, therefore, can materially decrease the time needed to reach the suitable material thickness.

Figure 7:
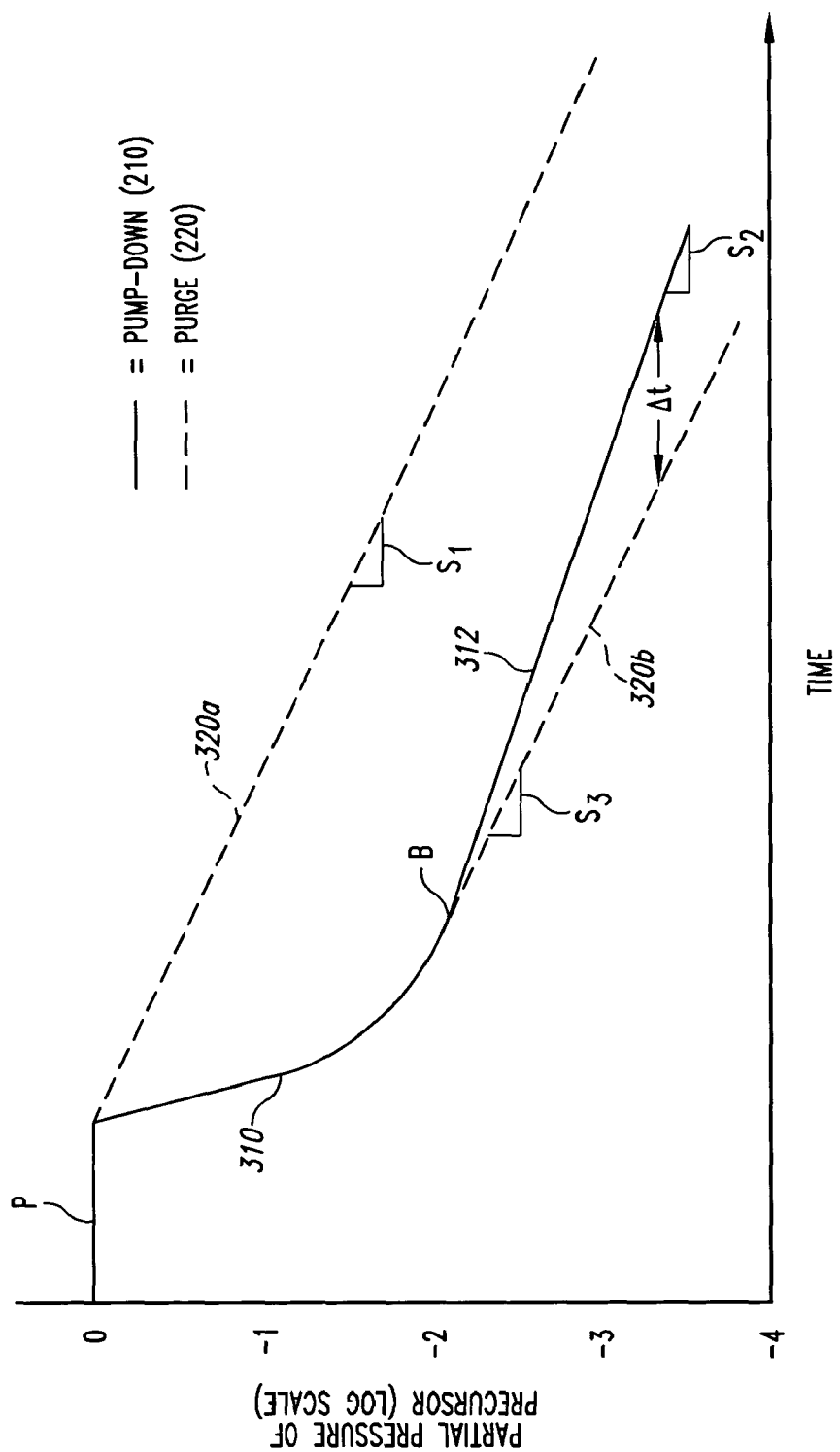
FIG. 7 is a graph schematically illustrating partial pressure of a precursor gas during various pump and/or purge processes.

FIG. 7 is a schematic graph comparing the expected concentration of a precursor, expressed as a partial pressure of the precursor in the enclosure, during a purge process 220 only, during a pump-down process 210 only, and during a pump/purge process 200 in accordance with embodiments of the invention. In this graph, the process pressure P at which the pump/purge process 200 is initiated is arbitrarily set at 1 (i.e., 0 on the log scale of FIG. 7).

If the pump-down process 210 were omitted and the purge process 220 alone were relied on to reduce concentration of the precursor, one would expect to see the log of the partial pressure of the precursor decrease at a fairly constant rate over time. This is represented in FIG. 7 by dashed curve 320a, which is generally linear and has a relatively constant first slope $S_1$. The slope $S_1$ will vary with a number of factors, including the geometry of the enclosure 20, the relative spacing of the workpieces W, and the rate at which the vacuum withdraws gas from the enclosure. All other factors being equal, though, the slope $S_1$ generally will increase (i.e., the partial pressure will drop more quickly) with increasing flow rates of purge gas into the enclosure. It should be recognized that curve 320a is stylized and the partial pressure of the precursor may deviate noticeably from this relatively straight line, particularly at higher purge gas flow rates or higher vacuum extraction rates.

If the purge process 220 were omitted and the pump-down process alone were employed, one would expect to see a marked drop-off in the partial pressure of the precursor in a first phase 310, as illustrated in the solid curve of FIG. 7. Once the base pressure B (FIG. 6) is reached, though, further extraction of precursor from the main chamber 28 of the enclosure 20 is limited largely by the rate at which the precursor diffuses out of the spaces between adjacent workpieces W. Hence, one would expect to see the log of the partial pressure of the precursor decrease at a fairly constant terminal rate during a second phase 312, yielding a generally linear curve having a second slope $S_2$. This second slope $S_2$ is expected to be less than the first slope $S_1$ of curve 320a. One advantage of the pump-down process 210 is that the partial pressure of the precursor drops off rapidly in the first phase 310 to quickly reduce the partial pressure below a level that promotes further adsorption. This facilitates more precise control over the time the workpieces W are exposed to material concentrations of the precursor.

The pump/purge process 200 illustrated in FIGS. 4–6 is expected to achieve benefits of both the pump-down process 210 and the purge process 220, yet reduce the total time needed to reduce the concentration of precursor in the enclosure to an acceptable level before introducing the next precursor. In the particular example shown in FIG. 7, the pump-down process 210 continues until the enclosure pressure reaches the base pressure B, taking advantage of the rapid decrease in partial pressure of the precursor in the first phase 310 of the pump-down. Rather than continuing the second phase 312 of the pump-down process 210, though, the purge process 220 is initiated promptly after reaching the base pressure B. Curve 320b, which illustrates the partial pressure of precursor during this purge process 220, may be a relatively straight line having a slope $S_3$ that is greater than the slope $S_2$ of the partial pressure curve in the second phase 312 of the pump-down process 210. It is anticipated that the slopes $S_1$ and $S_3$ of curves 320a and 320b, respectively, will be similar and may be substantially the same. As illustrated in FIG. 7, the increased slope $S_3$ of curve 320b compared to slope $S_2$ during the second pump-down phase 312 will result in a time savings $\Delta t$ in achieving the same partial pressure of the precursor. As a consequence, the pump/purge process 200 will allow the concentration of precursor in the main chamber 28 of the enclosure 20 to be reduced to the same level in a shorter period of time than either the pump-down process 210 alone (the solid curve in FIG. 7) or the purge process 220 alone (curve 320a), increasing throughput of the reactor 10.

In the particular embodiment shown in FIG. 7, the purge process 220 is initiated promptly upon reaching the base pressure B. In other embodiments, the pump-down process 210 is allowed to continue for a limited time (e.g., 3 seconds or less) thereafter. Because the slope $S_2$ of the partial pressure curve in the second phase 312 of the pump-down 210 is less than the slope $S_3$ of curve 320b, though, delaying initiation of the purge process 220 will reduce the time savings $\Delta t$. In other embodiments, the time purge process 220 is initiated before the base pressure B is reached. In the particular embodiment illustrated in FIG. 6, for example, the purge process 220 starts while the enclosure pressure is slightly higher than the base pressure B achievable in a steady state second phase 312 of the pump-down process 210. In some embodiments of the invention, the purge process 220 is initiated when the difference between the enclosure pressure and the process pressure P is at least 90% of the difference between the base pressure B and the process pressure P. In one particular embodiment, the purge process 220 is initiated when the difference between the enclosure pressure and the process pressure P is at least 90% of the difference between the base pressure B and the process pressure P, but no later than reaching the base pressure. This will achieve the rapid initial drop-off in partial pressure of the precursor, but initiate the purge process 220 before the less productive second phase 312 of the pump-down process 210.

The diffusion rate of any given gas will vary with pressure, with the diffusion rate increasing as pressure is reduced. Different gases diffuse at different rates, though. For example, the diffusion rate D for $TiCl_4$ in nitrogen is expected to be on the order of 0.032 $m^2$/s at an enclosure pressure of about 1 torr, but this diffusion rate will increase to about 0.80 $m^2$/s at about 0.04 torr. In contrast, $NH_3$, which may be used as a second precursor with $TiCl_4$ to deposit TiN, has a diffusion rate D in nitrogen of about 0.088 $m^2$/s at about 1 torr, which climbs to about 2.2 $m^2$/s at about 0.04 torr. $NH_3$, therefore, should diffuse out of the spaces between the workpieces W more readily than $TiCl_4$.

The curves 310, 312, 320a, and 320b in FIG. 7 are expected to follow the same general relationship for most precursor gases, but the precise shapes of the curves (e.g., the slopes $S_{1-3}$) will vary from one gas to another. If the pump-down process 210 continues for a fixed time in all pump/purge processes 200 in the manufacturing process 100 of FIG. 4, this time may be selected so the enclosure pressure is reduced by at least 90% of the difference between the base pressure B and the process pressure P for both precursor gases. This may dictate that the enclosure pressure at the end of the pump-down process 210 will vary from one pump/purge process 200 to the next. In another embodiment, the parameters of the pump/purge process 200 may be varied depending on the diffusion characteristics of the precursor gas being purged. This will allow each pump/purge process 200 to be optimized, further enhancing throughput of the reactor 10 without compromising product quality.

The above-detailed embodiments of the invention are not intended to be exhaustive or to limit the invention to the precise form disclosed above. Specific embodiments of, and examples for, the invention are described above for illustrative purposes, but those skilled in the relevant art will recognize that various equivalent modifications are possible within the scope of the invention. For example, whereas steps are presented in a given order, alternative embodiments may perform steps in a different order. The various embodiments described herein can be combined to provide further embodiments.

Unless the context clearly requires otherwise, throughout the description and the claims, the words "comprise," "comprising," and the like are to be construed in an inclusive sense as opposed to an exclusive or exhaustive sense, i.e., in a sense of "including, but not limited to." Use of the word "or" in the claims in reference to a list of items is intended to cover a) any of the items in the list, b) all of the items in the list, and c) any combination of the items in the list.

In general, the terms used in the following claims should not be construed to limit the invention to the specific embodiments disclosed in the specification unless the above-detailed description explicitly defines such terms. While certain aspects of the invention are presented below in certain claim forms, the inventors contemplate various aspects of the invention in any number of claim forms. Accordingly, the inventors reserve the right to add additional claims after filing the application to pursue such additional claim forms for other aspects of the invention.

What is claimed is:

1. A method of depositing a material on a plurality of microfeature workpieces held in a spaced relationship within an enclosure of a processing system, the enclosure including a first precursor gas and having a first enclosure pressure, the method comprising:
   reducing pressure within the enclosure to a second enclosure pressure while introducing a flow of a purge gas into the enclosure at a first flow rate, the second enclosure pressure being less than the first enclosure pressure, the processing system having a base pressure at the first flow rate, and a difference between the second enclosure pressure and the first enclosure pressure being at least 90% of the difference between the base pressure and the first enclosure pressure; and
   after reducing the pressure within the enclosure to the second enclosure pressure, increasing flow rate of the purge gas to a second flow rate and increasing the pressure within the enclosure to a third enclosure pressure, the second flow rate being greater than the first flow rate and the third enclosure pressure being greater than the second enclosure pressure.

2. The method of claim 1 wherein the first flow rate is no greater than about 250 sccm.

3. The method of claim 1 wherein the first flow rate is between about 50 sccm and about 250 sccm.

4. The method of claim 1 wherein the second flow rate is at least about 1000 sccm.

5. The method of claim 1 wherein the second flow rate is at least about four times the first flow rate.

6. The method of claim 1 wherein the third enclosure pressure is at least about nine times the second enclosure pressure.

7. The method of claim 1 wherein the flow rate of the purge gas is increased to the second flow rate promptly upon reaching the second enclosure pressure.

8. The method of claim 1 further comprising, after increasing the pressure within the enclosure to the third enclosure pressure, introducing a flow of a second precursor gas to the enclosure with the pressure within the enclosure at a fourth enclosure pressure, a difference between the third enclosure pressure and the fourth enclosure pressure being about 0–10% of the fourth enclosure pressure.

9. The method of claim 8 wherein the fourth enclosure pressure is approximately equal to the first enclosure pressure.

10. The method of claim 8 wherein the third enclosure pressure is approximately equal to the fourth enclosure pressure.

11. The method of claim 8 further comprising, after introducing the flow of the second precursor gas:
   terminating the flow of the second precursor gas;
   reducing pressure within the enclosure to the second enclosure pressure while introducing a flow of a purge gas into the enclosure at the first flow rate; and
   increasing flow rate of the purge gas to the second flow rate and increasing the pressure within the enclosure to the third enclosure pressure.

12. The method of claim 8 further comprising, after introducing the flow of the second precursor gas:
   terminating the flow of the second precursor gas;
   reducing pressure within the enclosure to a fifth enclosure pressure while introducing a flow of a purge gas into the enclosure at the first flow rate, a difference between the fifth enclosure pressure and the first enclosure pressure being at least 90% of the difference between the base pressure and the first enclosure pressure and the fifth enclosure pressure being different from the second enclosure pressure; and
   increasing flow rate of the purge gas to the second flow rate and increasing the pressure within the enclosure to a sixth enclosure pressure, a difference between the sixth enclosure pressure and the fourth enclosure pressure being about 0–10% of the fourth enclosure pressure.

13. A method of depositing a material on a microfeature workpiece, comprising:
   positioning a plurality of microfeature workpieces within an enclosure of a processing system, each of the microfeature workpieces having a surface;
   exposing the surfaces of the microfeature workpieces to a first precursor gas at a first enclosure pressure to allow at least a monolayer of the first precursor gas to be adsorbed on the surfaces of the microfeature workpieces;
   reducing pressure within the enclosure to a second, lower enclosure pressure in a pump-down process, the pump-down process comprising withdrawing gas from the enclosure while introducing a purge gas at a first flow rate of no greater than about 250 sccm for a first period of time, the pump-down process reducing a partial pressure of the first precursor gas within the enclosure; and
   after the pump-down process, purging the enclosure in a purge process, the purge process comprising introducing the purge gas at a second flow rate of at least about 1000 sccm for a second period of time and allowing the enclosure pressure to increase to a third enclosure pressure that is greater than the second enclosure pressure;
   wherein the processing system has a base pressure at the first flow rate and a difference between the second enclosure pressure and the first enclosure pressure being at least 90% of the difference between the base pressure and the first enclosure pressure.

14. The method of claim 13 wherein the partial pressure of the first precursor gas within the enclosure decreases at a first rate profile during the pump-down process and the partial pressure of the first precursor gas decreases at a second rate profile during the purge process, the first rate profile having an initial rate and a terminal rate, the initial rate being substantially greater than the second rate and the second rate being greater than the terminal rate.

15. The method of claim 13 wherein the partial pressure of the first precursor gas within the enclosure is decreased at least two orders of magnitude during the pump-down process.

16. The method of claim 13 further comprising, after the purge process, exposing the surfaces of the microfeature workpieces to a second precursor gas at a fourth enclosure pressure, a difference between the third enclosure pressure and the fourth enclosure pressure being about 0–10% of the fourth enclosure pressure.

17. The method of claim 16 wherein the fourth enclosure pressure is approximately equal to the first enclosure pressure.

18. The method of claim 16 wherein the third enclosure pressure is approximately equal to the fourth enclosure pressure.

19. The method of claim 16 further comprising, after exposing the surfaces of the microfeature workpieces to the second precursor gas, repeating the pump-down process to reduce a partial pressure of the second precursor gas within the enclosure, then repeating the purge process.

20. The method of claim 16 wherein the pump-down process is a first pump-down process and the purge process is a first purge process, further comprising, after exposing the surfaces of the microfeature workpieces to the second precursor gas, carrying out a second pump-down process to reduce a partial pressure of the second precursor gas within the enclosure then carrying out a second purge process, the second pump-down process continuing for a third period of time that differs from the first period of time.

21. A method of depositing titanium nitride on a microfeature workpiece, comprising:
    positioning a plurality of microfeature workpieces in a spaced relationship within an enclosure of a processing system, each of the microfeature workpieces having a surface;
    introducing a flow of a first precursor gas to the enclosure to expose the surfaces of the microfeature workpieces to the first precursor gas at a first enclosure pressure and allowing at least a monolayer of the first precursor gas to be adsorbed on the surfaces of the microfeature workpieces, the first precursor gas comprising titanium;
    reducing pressure within the enclosure by withdrawing gas from the enclosure with a vacuum while introducing a purge gas at a first flow rate of no greater than about 250 sccm for a first period of time to reduce the pressure within the enclosure to a second, lower enclosure pressure and to decrease a partial pressure of the first precursor gas within the enclosure, the processing system having a base pressure at the first flow rate and a difference between the second enclosure pressure and the first enclosure pressure being at least 90% of the difference between the base pressure and the first enclosure pressure;
    upon reaching the second enclosure pressure, purging the enclosure by withdrawing gas from the enclosure with a vacuum while introducing the purge gas at a second flow rate of at least 1000 sccm for a second period of time and allowing the enclosure pressure to increase to a third enclosure pressure that is greater than the second enclosure pressure and to further decrease the partial pressure of the first precursor gas within the enclosure; and
    after reaching the third enclosure pressure, exposing the surfaces of the microfeature workpieces to a second precursor gas at a fourth enclosure pressure, a difference between the third enclosure pressure and the fourth enclosure pressure being about 0–10% of the fourth enclosure pressure, the second precursor gas comprising nitrogen.

22. The method of claim 21 further comprising, after exposing the surfaces of the microfeature workpieces to the second precursor gas:
    reducing pressure within the enclosure by withdrawing gas from the enclosure with the vacuum while introducing the purge gas at a third flow rate of no greater than about 250 sccm for a third period of time to reduce the pressure within the enclosure to a fifth enclosure pressure and to decrease a partial pressure of the second precursor gas within the enclosure, the processing system having a second base pressure at the third flow rate and a difference between the fifth enclosure pressure and the fourth enclosure pressure being at least 90% of the difference between the second base pressure and the fourth enclosure pressure; and
    upon reaching the fifth enclosure pressure, purging the enclosure by withdrawing gas from the enclosure with a vacuum while introducing the purge gas at a fourth flow rate of at least 1000 sccm for a second period of time and allowing the enclosure pressure to increase to a sixth enclosure pressure that is greater than the fifth enclosure pressure and to further decrease the partial pressure of the second precursor gas within the enclosure.

23. A method of depositing a material on a plurality of microfeature workpieces held in a spaced relationship within an enclosure of a processing system, the enclosure including a first precursor gas and having a first enclosure pressure, the method comprising:
    reducing pressure within the enclosure to a second enclosure pressure that is less than the first enclosure pressure, the processing system having a base pressure and a difference between the second enclosure pressure and the first enclosure pressure being at least 90% of the difference between the base pressure and the first enclosure pressure;
    after reducing the pressure within the enclosure to the second enclosure pressure, introducing a flow of a purge gas into the enclosure and increasing the pressure within the enclosure to a third enclosure pressure, the third enclosure pressure being greater than the second enclosure pressure; and
    after increasing the pressure within the enclosure to the third enclosure pressure, introducing a flow of a second precursor gas to the enclosure with the pressure within the enclosure at a fourth enclosure pressure, a difference between the third enclosure pressure and the fourth enclosure pressure being about 0–10% of the fourth enclosure pressure.

24. The method of claim 23 wherein the fourth enclosure pressure is approximately equal to the first enclosure pressure.

25. The method of claim 23 wherein the third enclosure pressure is approximately equal to the fourth enclosure pressure.

26. The method of claim 23 further comprising, after introducing the flow of the second precursor gas:
    terminating the flow of the second precursor gas; then
    reducing pressure within the enclosure to the second enclosure pressure; and then
    introducing a flow of the purge gas and increasing the pressure within the enclosure to the third enclosure pressure.

27. The method of claim 23 further comprising, after introducing the flow of the second precursor gas:
    terminating the flow of the second precursor gas;
    reducing pressure within the enclosure to a fifth enclosure pressure while introducing a flow of the purge gas, a difference between the fifth enclosure pressure and the first enclosure pressure being at least 90% of the difference between the base pressure and the first enclosure pressure and the fifth enclosure pressure being different from the second enclosure pressure; and introducing the purge gas to the enclosure and increasing the pressure within the enclosure to a sixth enclosure pressure, a difference between the sixth enclosure pressure and the fourth enclosure pressure being about 0–10% of the fourth enclosure pressure.

28. The method of claim 13 wherein the first flow rate is at least about 50 sccm.

29. The method of claim 13 wherein the second flow rate is at least about 2000 sccm.

30. The method of claim 13 wherein the third enclosure pressure is at least about nine times the second enclosure pressure.

31. The method of claim 13 wherein the flow rate of the purge gas is increased to the second flow rate promptly upon reaching the second enclosure pressure.

* * * * *